United States Patent [19]

Aug et al.

[11] 4,420,203
[45] Dec. 13, 1983

[54] SEMICONDUCTOR MODULE CIRCUIT INTERCONNECTION SYSTEM

[75] Inventors: Conrad J. Aug, Preston; Charles J. Guenther; James B. Randolph, both of Rochester, all of Minn.

[73] Assignee: International Business Machines Corporation, Armonk, N.Y.

[21] Appl. No.: 270,427

[22] Filed: Jun. 4, 1981

[51] Int. Cl.³ .......................................... H01R 23/66
[52] U.S. Cl. .............................. 339/17 CF; 339/17 F; 339/75 M
[58] Field of Search ............. 339/17 CF, 17 F, 75 R, 339/75 M, 176 MF

[56] References Cited

U.S. PATENT DOCUMENTS

| | | | |
|---|---|---|---|
| 3,177,103 | 4/1965 | Tally et al. | 156/3 |
| 3,189,863 | 6/1965 | Leach | 339/99 |
| 3,289,141 | 11/1966 | White | 339/17 |
| 3,319,216 | 5/1967 | McCullough | 339/176 |
| 3,356,983 | 12/1967 | Johnson, Jr. | 339/14 |
| 3,393,392 | 7/1968 | Shelly | 339/17 |
| 3,573,704 | 4/1971 | Tarver | 339/14 |
| 3,597,660 | 8/1971 | Jensen et al. | 339/17 |
| 3,614,710 | 10/1971 | Glickmann | 339/75 R |
| 3,629,787 | 12/1971 | Wilson | 339/17 F |
| 3,701,964 | 10/1972 | Cronin | 339/17 F |
| 3,721,940 | 3/1973 | Michel et al. | 339/17 F |
| 3,731,258 | 5/1973 | Spicer | 339/48 |
| 3,740,698 | 6/1973 | Jerominek | 339/17 F |
| 3,796,986 | 3/1974 | Tamburro | 339/92 M |
| 3,937,857 | 2/1976 | Brummett et al. | 427/98 |
| 3,999,826 | 12/1976 | Yurtin | 339/17 F |
| 4,000,393 | 12/1976 | Cochran et al. | 219/216 |
| 4,012,093 | 3/1977 | Crane | 339/17 F |
| 4,060,295 | 11/1977 | Tomkiewicz | 339/17 LC |
| 4,116,517 | 9/1978 | Selvin et al. | 339/17 F |
| 4,125,310 | 11/1978 | Reardon et al. | 339/92 M |
| 4,164,003 | 8/1979 | Cutchaw | 339/17 CF |
| 4,169,642 | 10/1979 | Mouissie | 339/17 F |
| 4,246,596 | 1/1981 | Iwasaki | 357/79 |
| 4,246,597 | 1/1981 | Cole et al. | 357/81 |
| 4,293,175 | 10/1981 | Cutchaw | 339/17 CF |

OTHER PUBLICATIONS

IBM Technical Disclosure Bulletin, "Transmission Line Cable Connector", D. O. Johnson, Jr., vol. 9, No. 10, Mar. 1967.

Hughes Aircraft Advertisement, "A New Connector for Flex Circuitry", Feb. 1979, Electronic Packaging & Prod. p. 27.

Primary Examiner—John McQuade
Attorney, Agent, or Firm—Carl W. Laumann, Jr.

[57] ABSTRACT

This circuit system accommodates the interconnection of a plurality of modules, each containing a plurality of semiconductor chips, by means of a flexible printed circuit wiring assembly containing contact pads and an interconnection wiring pattern. The modules contain a set of contact pads corresponding to the pads on the flexible wiring assembly and alignment pins to bring the abutting pads into registration. The pads on the flexible wiring assembly have a plurality of contact bumps to make better contact with the module packs. Clamping means is provided to retain the module and exert pressure on the contact pads.

12 Claims, 6 Drawing Figures

FIG. 5
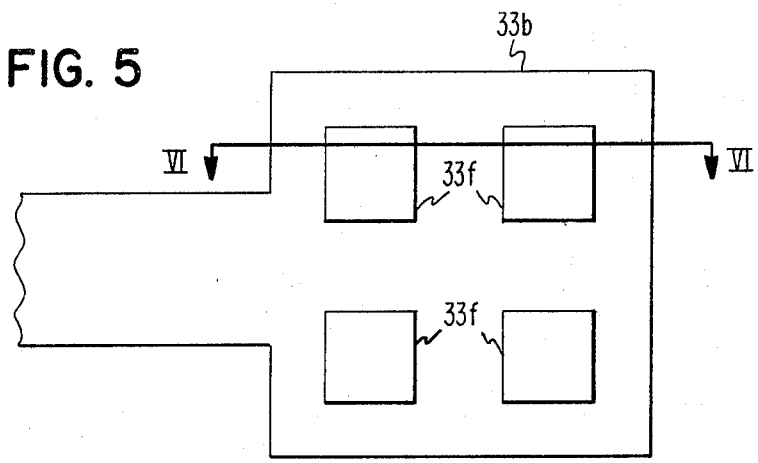
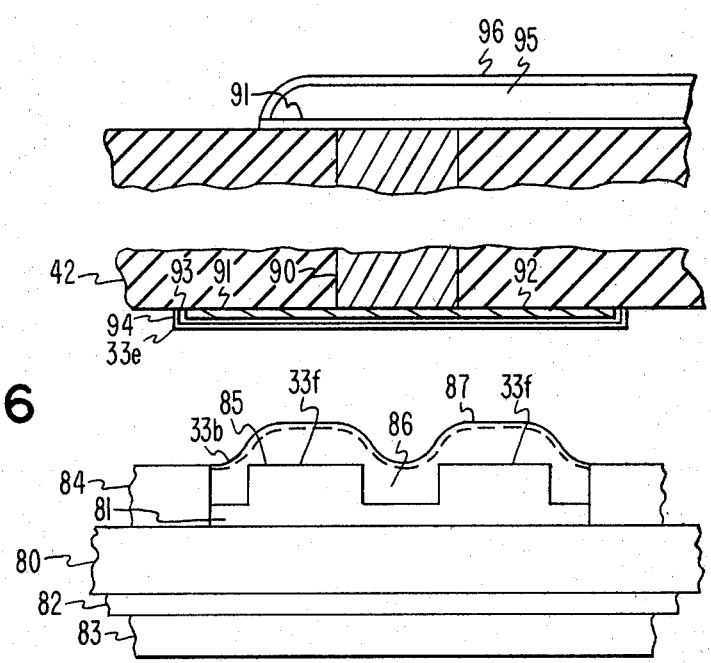
FIG. 6

SEMICONDUCTOR MODULE CIRCUIT INTERCONNECTION SYSTEM

BACKGROUND OF THE INVENTION

1. Field of the Invention

This invention relates to a circuit system to interconnect semiconductor module carriers, each having a plurality of semiconductor chips, by means of a flexible printed circuit carrier having contact pads which match corresponding contact pads on the module carrier.

2. Description of the Prior Art

As semiconductor processing techniques are improved, chips of ever increasing density can be produced. Semiconductor modules have improved from two or three pin packaging used for diodes and transistors to four, eight and sixteen pin flat packs and the larger 200-400 pin modules. The point has been reached where pin type connections are no longer adequate. There is a physical limitation on the number of pins which can be placed in a given area since each pin must be sufficiently large to withstand the normal insertion force. While low insertion force connection schemes have been devised they generally require more space and costly assembly devices. Even where pins are adequately sized to handle normal insertion forces a slight misalignment can easily result in a bent pin which leads to a scrap module. With simpler devices a modest number of scrap modules due to pin damage could be tolerated since the unit cost was not excessive. In the case of a large module with many circuits the cost has reached the point where module loss due to pin damage is no longer acceptable.

Another problem with pin connection arises during the module manufacturing process. The thermal mismatch between ceramic substrates and epoxy glass cards causes cracks during the step in which the module is soldered into the card. In addition, the brazing process is difficult to control and the fall out from this step is relatively high. Since the modules are virtually complete at the point when pins are brazed any scrap is very expensive. An alternative process with high yields and little scrap is very desirable.

The increased density of semiconductor modules and the resulting need for a greater number of connection pins has also led to the need for cable type connectors with greater numbers of pins and smaller size. Although the problems are similar, they are not identical and the differences have prevented the ready transfer of existing plug connection systems to semiconductor modules. As an example, a semiconductor module commonly dissipates so much heat that the design must provide for effective heat dissipation. Further, the semiconductor module desirably carries more connection points than the usual connector.

On the other hand, semiconductor modules have not usually required the ease of insertion which connectors must have. This aspect is now changing. Circuit density on semiconductor modules has reached the point where replacement of a defective pluggable card carrying multiple permanently mounted modules is not economically feasible. The defective module alone must be replaced. Generally this replacement is performed in a field environment which rules out the use of elaborate jigs or tools for this task.

The point has therefore been reached where there is a need for a high density connection system which has the characteristics of an easily used connector but which nevertheless accommodates all the particular requirements of a semiconductor package such as a large number of connection points and the ability to effectively dissipate heat.

SUMMARY OF THE INVENTION

The present invention provides a high reliability connection to a large number of points on a semiconductor module by applying pressure to the module in a fashion which causes contact points on the module to bear against contact points on a flexible printed circuit wiring assembly backed by a elastomer. One or more modular semiconductor chips are mounted on an insulating carrier which may be of ceramic material carrying a pattern of conductors interconnecting the modules. The carrier is in turn mounted in a metal retainer. The carrier is positioned over a flexible printed circuit wiring assembly carrying a pattern of interconnection pads. Alignment pins on the carrier mate with alignment holes in the wiring assembly to position connection pads on the modules in abutting relationship to the pads on the wiring assembly. A cam and lever assembly, positioned over the carrier, applies pressure to the carrier through slotted Bellville springs, forcing the abutting pads into electrical contact. Small differences in the pad heights are accommodated by an elastomeric backing to the wiring assembly.

It is, therefore, an object of this invention to provide an improved connection system for semiconductor modules.

It is another object of this invention to provide a semiconductor module connection system which allows modules having a large number of connection points to be connected to a flexible substrate without the use of conductive pins.

It is still another object of this invention to provide a semiconductor module connector accommodating a large number of connection points in closely spaced arrangement which is easily removed or replaced without the use of tools or jigs.

Still another object of this invention is to provide a semiconductor module connection system which is not susceptible to damage during the connection operation.

Other objects, features and advantages will become apparent from the following more complete explanation of the preferred embodiment and the accompanying drawings.

BRIEF DESCRIPTION OF THE DRAWINGS

FIG. 5 is a plan view of an individual contact which mates with a contact on the semiconductor module.

FIG. 6 is a sectional view, with parts cut away, of a pair of abutting contacts taken along the line VI—VI of FIG. 5.

DESCRIPTION OF THE PREFERRED EMBODIMENT

Figure 1:
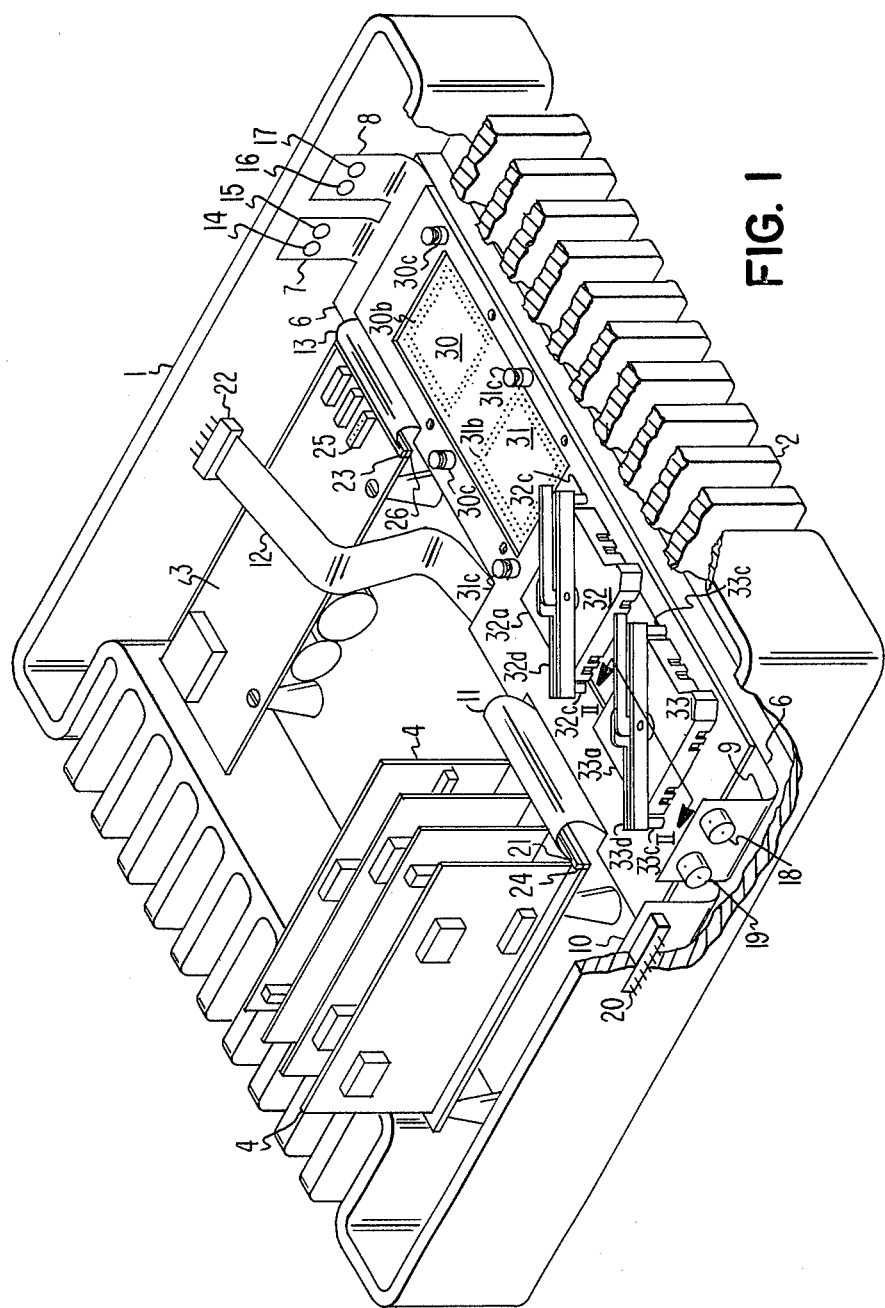
FIG. 1 is an isometric view, with parts cut away, of an electronic system showing semiconductor modules connected with the system of this invention.

The electronic assembly shown in FIG. 1 includes a housing or base member 1 which may be die cast from aluminum or other material having the necessary mechanical and heat transfer characteristics. The preferred material in most cases will be aluminum. Heat dissipating fins 2 improve the ability of the housing to dissipate heat generated by the components mounted on the interior surfaces of the housing. The housing accommodates conventional circuit packages such as a power supply 3 and printed circuit cards 4 which may utilize conventional interconnection systems, plugs and sockets. These elements form no part of the invention but are included to demonstrate compatibility with existing devices.

The circuit interconnection system of this invention includes a flexible substrate which serves as a printed circuit wiring assembly 6 fabricated from a suitable insulating material such as KAPTON TM (available from DuPont company) in the range of 0.05 mm thick. The assembly 6 will generally include one or more layers of ½ oz. copper with suitable insulating overlays. Such structures are easily fabricated using well known techniques.

Printed circuit assembly 6 will generally include cable portions 7-13 having conventional coaxial jacks 14-19 and interconnection plugs 20-23. These plugs can be used to mate with sockets 24-26 within the assembly or provide the point of connection to external assemblies by conventional cables not shown. Additional connections to external assemblies can be made via coaxial jacks 14-19.

In the embodiment of FIG. 1, the flexible printed circuit wiring assembly has positions 30, 31, 32 and 33 for semiconductor module carriers, only two of which 32a and 33a are shown. Each of the positions has a plurality of contact pads 30b, 31b arranged in a generally hollow rectangular pattern. The contact pads for module positions 32 and 33 are obscured by module carriers 32a and 33a.

Each position has a pair of clamp mount pins 30c, 31c, 32c and 33c to support the lever operated cam clamping assemblies, two of which, 32d and 33d, are shown.

Figure 2:
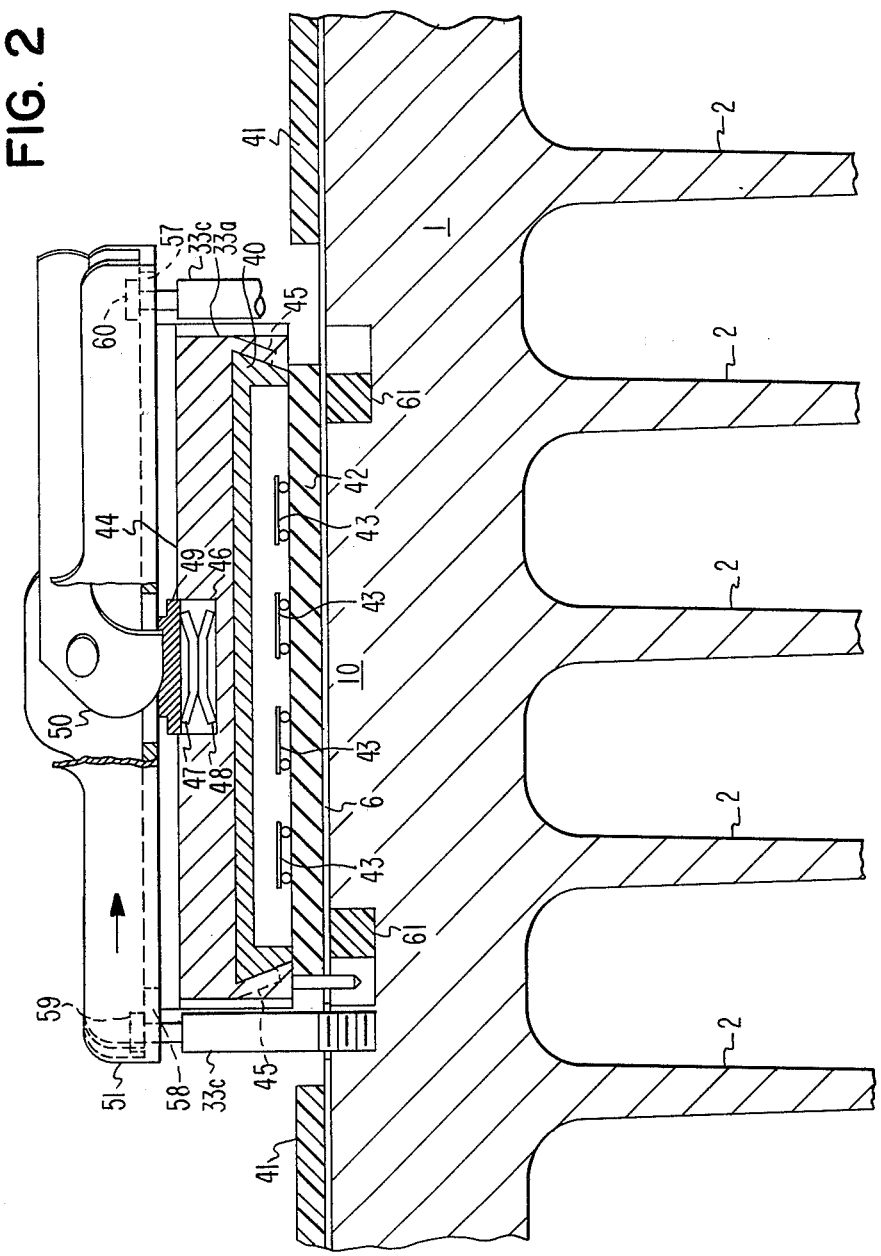
FIG. 2 is a partial sectional view of a single module along the line II—II of FIG. 1.

A more detailed showing of module carrier 33a and its associated structure is shown in FIG. 2, a partial sectional view taken generally along the line II—II of FIG. 1. For the purpose of drawing clarity, some elements, such as clamp assembly 33d are shown with parts cut away instead of a true sectional view.

Housing 1 has a number of cooling fins 2 on the exterior side and a heat sink portion 10 located in abutting relationship to the portion of printed circuit assembly 6 which lies adjacent to module carrier 33a. In the regions not populated with module carriers printed circuit wiring assembly 6 may be laminated to a stiffener 41. The module carrier includes a substrate 42 of ceramic or other suitable material having a plurality of semiconductor modules 43 electrically connected to a wiring pattern, not shown, on substrate 42. The mounting and connection can be accomplished by well known means such as solder ball technology. A module cap 40 of suitable metal such as Alloy F15 is affixed to ceramic substrate 42 by conventional means such as solder bonding. The sides of cap 40 are tapered to provide a convenient attachment means for the module retainer 44 by means of crimp tabs 45. Cap 44 has a circular depression 46 which accommodates a pair of Bellville washers 47 and 48. A movable plug 49 which slides within depression 46 is depressed downwardly by the action of cam lever 50 in the position shown. Cam support bracket 51 is held in position by means of support pins 33c. A pair of slots 57 and 58 in bracket 51 engage the reduced diameter portions of pins 33c. To mount the bracket 51, the cam lever 50 is rotated to a vertical position. The slots are the familiar keyhole shape so that the heads 59 and 60 will pass through the bracket 51 as the bracket is lowered into position. After heads 59 and 60 are through the bracket, a slight motion in the direction of the arrow places the pins in the narrow portion of the slots so that heads 59 and 60 bear against the bracket. At this point cam lever 50 is rotated to the position shown. This causes compression of the springs 47 and 48, thereby urging module carrier 33a downwardly. The elastomeric backing element 61 provides a resilient backing for the printed circuit assembly 6 in the region of the electrical contacts.

Figure 3:
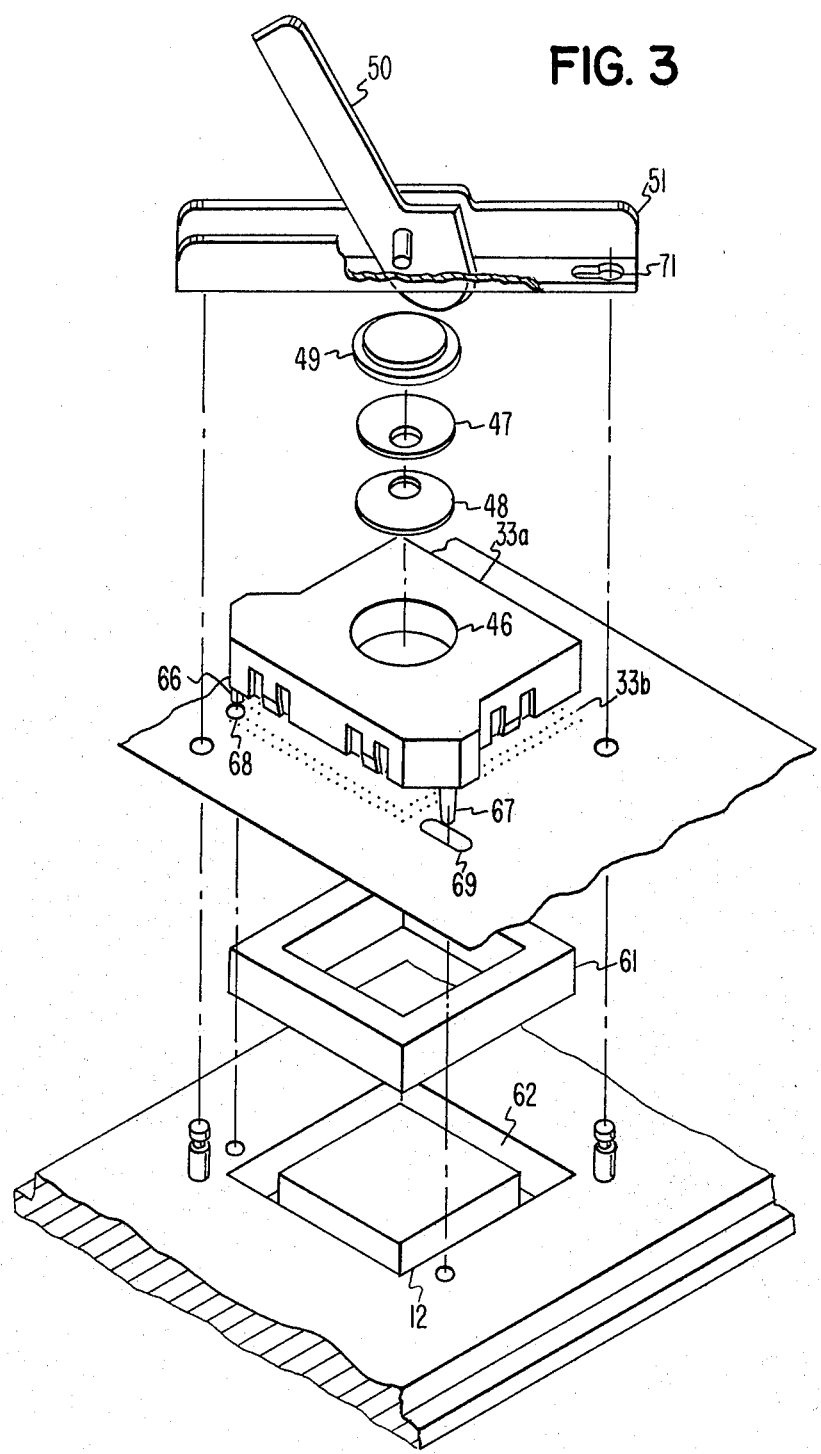
FIG. 3 is an exploded view of the semiconductor module connection system of this invention.

The assembly of the primary components is shown in the exploded view of FIG. 3. It can be seen that elastomeric backing element 61 is shaped in the form of a hollow rectangle. A recessed portion 62 of housing 1 accommodates elastomeric element 61. The depth of the recess is less than the height of element 61 so that a portion of element 61 protrudes above the surface of housing 1.

The contact pads 33b on printed circuit wiring assembly 6 are located in the area which overlies the elastomeric element 61. Module 33a is accurately positioned with respect to printed circuit wiring assembly 6 by means of alignment pins 66 and 67. Pin 66 fits into a hole 68 in flexible substrate 6 while pin 67 is indexed by slot 69. This arrangement is advantageous in accommodating the dimensional instability of the flexible printed circuit wiring assembly 6. If two round holes were used, the flexible assembly would buckle in the region between the pins under conditions of high humidity. Conditions of low humidity would cause it to shrink which would deform the holes or cause substrate 6 to rip.

The manner in which the Belville washers 47, 48; the plunger 49 and cam lever 50 interrelate is also shown. The keyhole slot 71 in cam support bracket 51 is shown in the cut-away view of the assembly.

While no circuit pattern of conductors is visible in FIG. 3 it will be appreciated that printed circuit wiring assembly 6 can have a single layer of wiring on one surface or a plurality of layers can be accommodated by lamination. In either case the appropriate conductors must make contact with the contact pads which in turn make contact with the contact pads on the module carrier.

Figure 4:
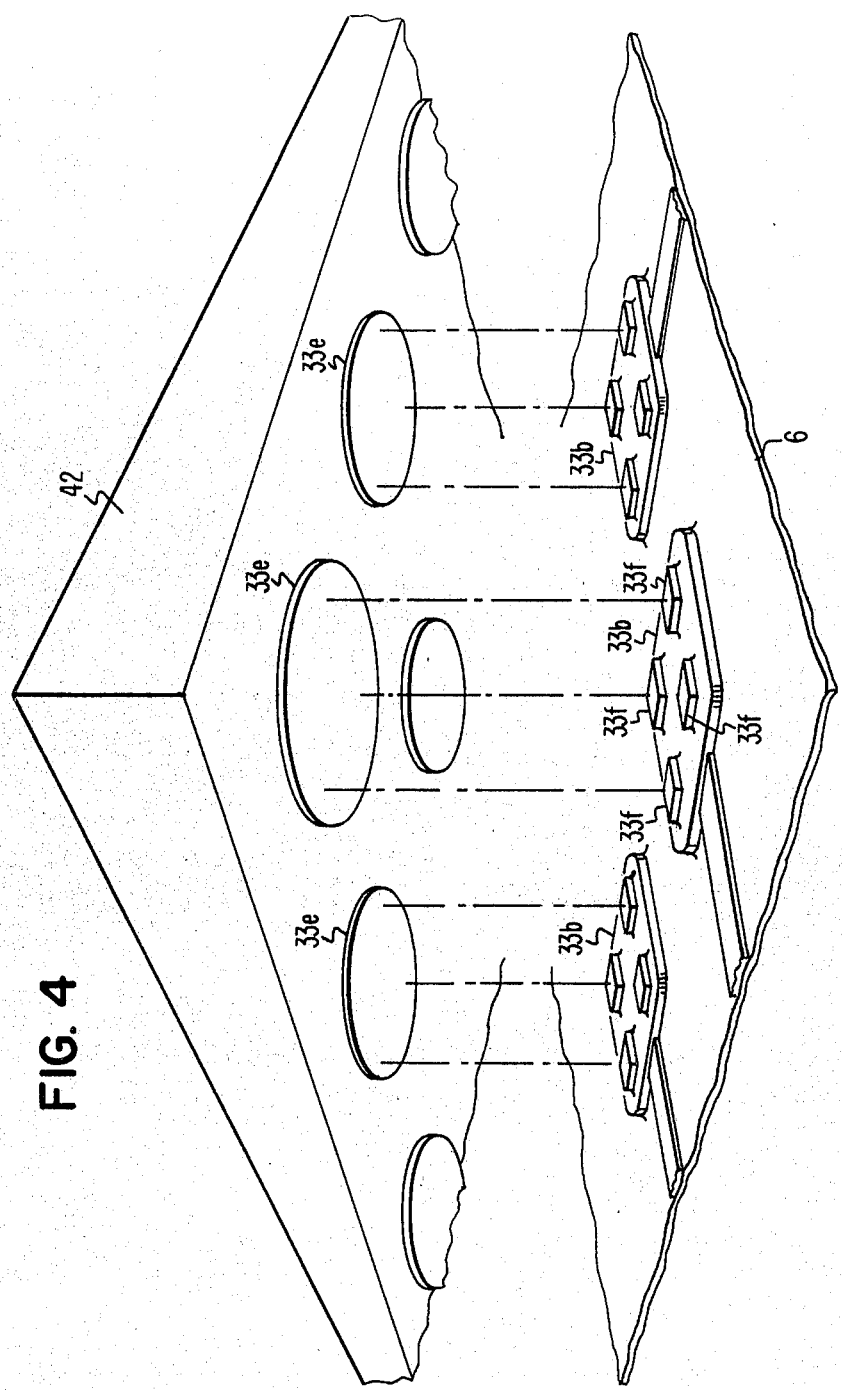
FIG. 4 is an exploded view of the abutting contact surfaces.

The relationship between the abutting contacts is shown in FIG. 4. This perspective exploded view shows a segment of the corner area. The module substrate 42 has a plurality of contact pads 33e which are positioned in abutting relationship with contact pads 33b on printed circuit wiring assembly 6.

Each of the pads 33e has a substantially flat surface. Contact pads 33b, on the other hand, have a plurality of raised contact bumps 33f. The quality of the electrical connection between the abutting pads is substantially enhanced by these bumps. Alignment problems are reduced since even when abutting pads are misaligned to the extent where only a single bump is in contact with the upper pad the quality of electrical contact is more than adequate.

The detailed nature of the contact pads is illustrated in FIGS. 5 and 6. In FIG. 5, which is a plan view of contact pad 33b, four contact bumps 33f are shown. This is the preferred number and arrangement. Although the drawing is not made to scale the outside dimension of contact pads 33b is about 0.65 mm. The individual contact bumps 33f are 0.15 mm square and are separated from each other by a like dimension.

FIG. 6 is a sectional view taken along the line VI—VI. In addition to showing contact pad 33b, FIG. 6 shows the module contact pad 33e with parts cut away.

Contact pad 33b is fabricated on a flexible printed circuit wiring assembly comprising a substrate of flexible insulating material 80 such as Kapton in the range of 0.05 mm thickness. The upper surface has an etched pattern of ½ oz. copper 81 which forms the 0.65 mm pads and connections shown in FIG. 5. The lower surface has an etched pattern of ½ oz. copper 82 which makes connection to various pads and connectors by means of plated through holes not shown. The lower surface also has a coverlay of 0.025 mm Kapton 83 to provide electrical insulation for the etched pattern in copper layer 82.

The upper surface has a coverlay of 0.025 mm Kapton 84 which protects the etched copper pattern 81. The copper bumps 85 are added to the underlying copper layer 81 by means of an electroplating process before the remainder of the circuit pattern is etched with conventional dry film resist and ammoniated alkaline etchant.

Subsequent to etching, the Kapton coverlay 84 is applied, leaving the copper contact pads 33b exposed. The exposed copper bumps are covered with a 0.025-0.05 mm layer of electroless nickel 86 and finished with a 0.00178-0.00254 mm layer of electroless gold 87.

Also shown in FIG. 6 is a partial sectional view of contact pad 33e with parts cut away. Ceramic substrate 42, which is typically 1.5 mm in thickness has a tungsten conductor 90 about 0.2 mm in diameter which extends from the upper surface to the lower surface. Such conductors are fashioned by squeezing a tungsten paste into holes punched in the raw ceramic stock. A round tungsten pad 92 in contact with conductor 90 is screened on the lower surface by substrate 42. After firing the ceramic, a pattern of chrome conductors 91 is laid down on the upper surface of the ceramic substrate 42 to make connection with the semiconductor modules. The round pad 33e is in the range of 0.86 mm in diameter and is completed with a layer of electroless nickel 93 and a protective layer of electroless gold 94. The total thickness of pad 33e is about 0.015 mm. Connections on the upper surface are completed by evaporative deposition and photo etch of a layer of copper 95 and a final layer of chrome 96.

While it would be possible to put the contact bumps on the module instead of the printed circuit carrier, the election to place them on the printed circuit carrier is not simply a matter of choice. For example, it is desirable to lay down the copper bump with an electroplating process. In the case of the flexible printed circuit carrier a common electrical connection is readily available for the electroplating. No such connection exists on the module.

Other considerations provide additional advantages. For example, the processed ceramic module will typically be much more expensive than the flexible printed circuit carrier. The copper bumps would be an end of the line process. That is, the other process steps associated with the ceramic substrate would be completed first. This would increase the cost of the fallout which would result from the process step which creates the bump.

In addition to these considerations, if the flat pad without the bumps, which is larger than the pad with the contact bumps, was applied to the flexible printed circuit carrier it would not be possible to run the wiring pattern between the outside pads to those in the inner row. This is not a problem on the ceramic module because there is no wiring pattern on the bottom surface.

We claim:

1. A circuit interconnection system for a semiconductor module carrier having a plurality of contact pads on a rigid planar surface, comprising:
   a planar flexible printed circuit wiring assembly having first and second surfaces;
   a plurality of mating contact pads on said first surface adapted to make electrical contact with contact pads on a module carrier;
   a plurality of raised solid contact bumps on each of said mating contact pads;
   guide means on said flexible printed circuit wiring assembly for positioning a module carrier to place the plurality of contact pads on said module carrier in alignment with said mating contact pads of said flexible printed circuit wiring assembly;
   an elastomeric backing element confronting said second surface of said flexible printed circuit wiring assembly in the region opposite said mating contact pads;
   clamping means operable to compressively retain said flexible printed circuit wiring assembly between a module carrier and said elastomeric backing element for maintaining compressive contact between module carrier contact pads and said flexible printed circuit mating contact pads aligned therewith.

2. A system according to claim 1 in which said guide means includes at least two holes in said flexible printed circuit wiring assembly adapted to receive a pair of alignment pins affixed to the module carrier.

3. A system according to claim 1 in which said mating contact pads are arranged in a hollow rectangle on said first surface, and
   said elastomeric backing element is in the shape of a hollow rectangle.

4. A system according to claim 1 in which said clamping means includes a base member adjacent to said elastomeric backing element in the region of said mating contact pads.

5. A system according to claim 4 in which said base member abuts said printed circuit wiring assembly in the regions not having said mating contact pads.

6. A system according to claim 5 in which said base member is adapted to provide a heat sink relationship with a portion of the module carrier.

7. A system according to claim 4 in which said clamping means further includes a cam lever detachably mounted on said base member,
   said cam lever having a first position to compress the contact pads of a module carrier against said flexible printed circuit wiring assembly mating contact pads,
   said cam lever having a second, released, position which allows removal of said cam lever and a module carrier.

8. A circuit interconnection system comprising:

a semiconductor module carrier having a plurality of contact pads on a rigid planar surface, a planar flexible printed circuit wiring assembly having first and second surfaces, a plurality of mating contact pads on said first surface adapted to make electrical contact with contact pads on said module carrier, a plurality of raised solid contact bumps on each of said mating contact pads, guide means on said flexible printed circuit wiring assembly for positioning said module carrier to place said plurality of contact pads on said carrier in alignment with said mating contact pads on said flexible printed circuit wiring assembly, an elastomeric backing element confronting said second surface of said flexible printed circuit wiring assembly in the region opposite said mating contact pads, clamping means, including a base member, operable to compressively retain said flexible printed circuit wiring assembly between said module carrier and said elastomeric backing element for maintaining compressive contact between module carrier contact pads and said flexible printed circuit mating contact pads aligned therewith, said base member abutting said printed circuit wiring assembly to provide a heat sink relationship to a portion of the module carrier.

9. A system according to claim 8 in which said guide means includes at least two holes in said flexible printed circuit wiring assembly adapted to receive a pair of alignment pins affixed to the module carrier.

10. A system according to claim 8 in which said mating contact pads are arranged in a hollow rectangle on said first surface, and said elastomeric backing element is in the shape of a hollow rectangle.

11. A system according to claim 8 in which said clamping means further includes a cam lever detachably mounted on said base member, said cam lever having a first position to compress the contact pads of said module carrier against said flexible printed circuit wiring assembly mating contact pads, said cam lever having a second, released, position which allows removal of said cam lever and said module carrier.

12. A system according to claim 11 in which said cam lever bears against the center of said module carrier, the contact pads on said module carrier are disposed about the periphery of the rigid planar surface and the interior of the planar surface abuts the printed circuit wiring assembly opposite said base member to effect the transfer of heat from said module carrier to said base member.

* * * * *